US006747573B1

(12) United States Patent
Gerlach et al.

(10) Patent No.: US 6,747,573 B1
(45) Date of Patent: Jun. 8, 2004

(54) APPARATUS AND METHOD FOR GENERATING CODED HIGH-FREQUENCY SIGNALS

(75) Inventors: Horst Gerlach, Neutraubling (DE); Franz Kammerl, Holzheim (DE); Gerd Scholl, München (DE); Thomas Ostertag, Finsing (DE); Frank Schmidt, Pöring (DE); Wolf-Eckhart Bulst, München (DE)

(73) Assignee: EnOcean GmbH (DE)

( * ) Notice: Subject to any disclaimer, the term of this patent is extended or adjusted under 35 U.S.C. 154(b) by 0 days.

(21) Appl. No.: 09/367,429

(22) PCT Filed: Feb. 12, 1998

(86) PCT No.: PCT/DE98/00403

§ 371 (c)(1),
(2), (4) Date: Aug. 12, 1999

(87) PCT Pub. No.: WO98/36395

PCT Pub. Date: Aug. 20, 1998

(30) Foreign Application Priority Data

| Feb. 12, 1997 | (DE) | 197 05 341 |
| Apr. 15, 1997 | (DE) | 197 15 727 |
| Apr. 15, 1997 | (DE) | 197 15 728 |

(51) Int. Cl.[7] ............................................. G08C 19/16
(52) U.S. Cl. ........................... 340/870.21; 340/870.33; 340/825.72; 455/127
(58) Field of Search ............... 340/870.21, 870.16, 340/825.72, 870.3, 870.33; 455/127

(56) References Cited

U.S. PATENT DOCUMENTS

| 3,596,262 A | | 7/1971 | Rollwitz et al. | |
| 3,735,412 A | * | 5/1973 | Kampmeyer | 340/825.72 |
| 3,824,857 A | | 7/1974 | Smith | |
| 4,001,798 A | * | 1/1977 | Robinson | 340/870.18 |
| 4,177,438 A | | 12/1979 | Vittoria | |
| 4,177,800 A | * | 12/1979 | Enger | 600/302 |
| 5,151,695 A | * | 9/1992 | Rollwitz et al. | 340/870.33 |
| 5,301,362 A | | 4/1994 | Ohkawa | |
| 6,014,896 A | * | 1/2000 | Schoess | 73/583 |

FOREIGN PATENT DOCUMENTS

| DE | 2943 932 | 6/1980 |
| DE | 41 05 339 A1 | 8/1992 |
| DE | 42 32 127 | 3/1994 |
| DE | 43 09 006 A1 | 9/1994 |
| DE | 43 12 596 | 10/1994 |
| DE | 196 19 311 | 12/1996 |
| EP | 0 319 781 | 6/1989 |
| EP | 0 617 500 A1 | 9/1994 |
| FR | 0 646 021 | 10/1990 |
| HU | 175853 | 11/1975 |
| WO | WO 96/15590 | 5/1996 |

* cited by examiner

*Primary Examiner*—Timothy Edwards
(74) *Attorney, Agent, or Firm*—Bell, Boyd & Lloyd LLC

(57) ABSTRACT

An apparatus and method for generating coded high-frequency signals, having a converter, which converts non-electrical primary energy available from the surroundings into electrical energy, an element with a nonlinear characteristic curve, which is coupled to the converter, and a coding device coupled to the element with a nonlinear characteristic curve.

26 Claims, 2 Drawing Sheets

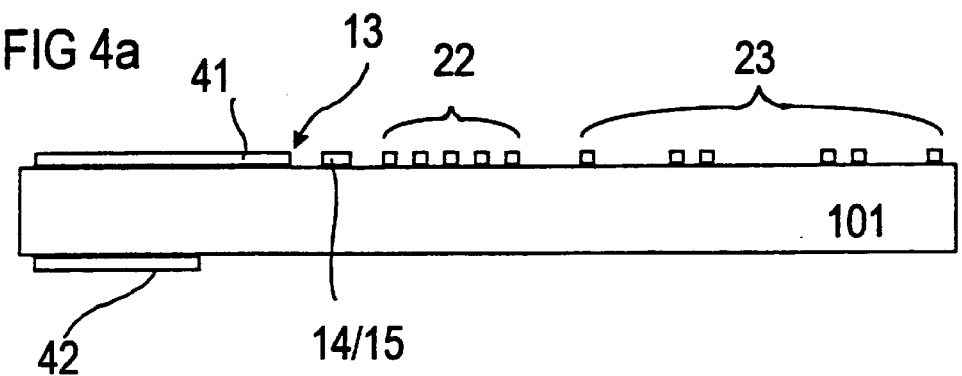
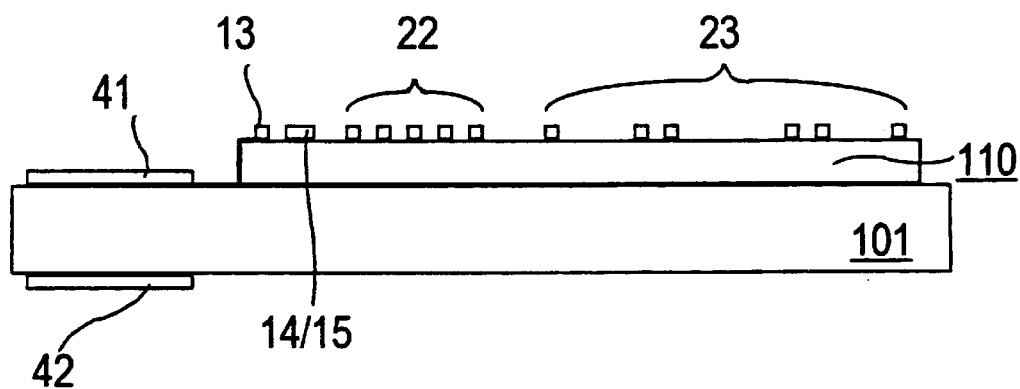

APPARATUS AND METHOD FOR GENERATING CODED HIGH-FREQUENCY SIGNALS

BACKGROUND OF THE INVENTION

1. Field of the Invention

The present invention relates to an apparatus and method for generating coded high-frequency signals wherein the apparatus includes a converter for converting a non-electrical primary energy into low-frequency electrical energy, an element for converting the low-frequency electrical energy into a high-frequency signal, and a coding device for generating a coded signal from the high-frequency electrical signal.

2. Description of the Prior Art

It is known to generate high-frequency energy signals with the aid of low-frequency electrical energy; e.g., direct current (battery), power supply frequency current and similar energy from similar energy sources. Radio-frequency transmitters fed from the power supply and battery-driven RF transmitters such as radio transceivers, mobile telephones or cordless telephones are widely known. Such apparatuses enable non-coded, but preferably coded/modulated, high-frequency signals to be emitted for diverse radio information transmissions. For the cases of battery operation, solar energy also may be used as the primary energy source, with the aid of which, given the presence of sufficient illumination, a rechargeable battery or an accumulator can be recharged or kept in its charge state.

It is also known for physical and similar data, measurement variables, etc., to be interrogated remotely. One example of such remote interrogation is a remote thermometer by means of which the temperature, such as that of a hot boiler, is measured and displayed at a location remote from the boiler. For this purpose, a remote thermometer that operates purely electrically has a two-core electrical line between the temperature-sensitive sensor and the actual display device.

Equipment which can be interrogated remotely and in which the connection between sensor and display device is a radio transmission are also known. Although the data transmission takes place in a wirefree manner, a source for electrical energy is nevertheless necessary at the location of the sensor, namely for the transmitter. If the connection is intended to be completely wirefree, electrical battery energy feeding is used at the location of the data interrogation (unless an electrical source is otherwise available there). Furthermore, equipment which can be interrogated remotely without an electrical supply at the sensor are known. In the case of which the energy necessary for the data transmission is coupled in a wirefree manner, by means of a correspondingly high-energy and broadband interrogation pulse, into a surface wave device. From there it is sent back passively after suitable signal processing. What is disadvantageous about this, however, is the fact that the high-energy interrogation pulse has to be emitted regularly and all the more often the more accurately the measurement variable is to be determined or observed.

An object of the present invention is to specify, for a relatively specific operating case, the advantageously applicable generation of the electrical energy necessary for such a transmitter. This relatively specific operation involves carrying out a radio information transmission only in relatively short time intervals of interest, wherein the length of a respective time interval of this type is short (e.g., only 1 thousandth or less) relative to the pauses between such successive time intervals.

SUMMARY OF THE INVENTION

Accordingly, the present invention is based on the concept, preferably from the viewpoint of reducing the technical outlay and also of minimized maintenance, of finding a principle which enables a completely sufficient radio information transmission for the respective case, with energy other than electrical primary energy being expended.

In advance of the descriptions of individual examples, the principle underlying the present invention shall be briefly delineated, those parts of the description which then follow will serve to provide a more in-depth understanding of such principle.

The case of photovoltaic conversion already has been mentioned which, however, as is known and evident, can be made usable only to a limited extent. It is dependent on sufficient incidence of light and usually can be used only in conjunction with energy storage elements, or accumulators.

The present invention is geared to using energy that is available, occasionally even in a very large quantity and being referred to here as primary energy available from the surroundings, in order to provide electrical energy for generating a high-frequency signal (radio signal. Such primary energies that usually are not used are mechanical deformation energy, in particular pressure or other forces, friction forces (low-temperature), thermal energy, acceleration forces, radiation, oscillating masses and the like. Insofar as forces are referred to here, their temporal or local gradient is used for the present invention, the gradient being equivalent to an energy.

Examples of previously unused primary energies that may be and [lacuna] are the pressure/deformation energy fundamentally necessary for actuating an electrical switch, heat, e.g. from a radiator, that is available with a spatial or temporal temperature gradient and acceleration energy of an oscillating seismic mass, e.g., such as that in a vehicle. Other suitable primary energies are shaking, vibrating, and air movements. This exemplary enumeration is not exhaustive in relation to the present invention and must in no way be seen as a restriction of the application of the principle of the invention.

The integral principle of the present invention essentially consists in tapping off a proportion of energy from such process energy and converting such proportion of energy firstly into low-frequency electrical energy as defined here. In the most general form, according to the present invention, this is understood to mean in the first instance the separation of charges, as arises, e.g., as electrostatic charging due to friction. According to the present invention, the generation of a voltage having a slowly rising amplitude is also understood to be low-frequency. The voltage generated in pyroelectric or piezoelectric and also in photovoltaic components also be used in accordance with the present invention.

A next step is to transform this so-called low-frequency electrical energy into high-frequency electrical energy. For this purpose, an element with a nonlinear characteristic curve (nonlinear element) may be used in accordance with the present invention. Connection therewith this is understood to mean an element whose behavior changes abruptly as a function of the applied voltage starting from a specific limit value or in a limit value range. As a result, such an element generates a current pulse with a steep edge, which corresponds to a high-frequency signal in the frequency domain.

Depending on the bandwidth of this high-frequency signal, it may be necessary to filter out a narrower-band frequency spectrum from such signal. However, it is also possible to use a nonlinear element which already generates a sufficiently narrowband high-frequency signal by itself. This enables the full energy content of the high-frequency signal to be used.

A further step of the present invention is to code this high-frequency electrical energy with an information item and emit it as a coded (narrowband) high-frequency signal. This coding may be suitable for identification purposes and/or may also contain other information items; e.g., items concerning the nature and size of parameters acting on the coding device. These may be specific physical quantities such as, for instance, a temperature, a force or a sudden impedance change, or they may be chemical or biological parameters as well; e.g., concentration and/or nature of gases, vapors, liquids, substances or biological material such as viruses or genes.

A coded high-frequency signal is emitted, whose energy content, with narrowband selection being performed if appropriate, is necessarily relatively low but, nevertheless, sufficiently large within the scope of application of the present invention. It is surprising that, in spite of a low degree of conversion of the primary energy used into the energy of the coded high-frequency signal that is generated, there is no problem at all with respect to the beneficial application of the present invention.

In this respect, it should be pointed out that the radio receiving station (positioned at an appropriately limited distance) is designed and configured in a manner known, per se, such that it can detect the information of the received (coded) narrowband high-frequency signal. This is not a problem at the radio receiving end because the energy supply of the receiver can be ensured in a conventional manner; e.g., by means of an electricity power supply, batteries or the like.

Additional features and advantages of the present invention are described in, and will be apparent from, the Detailed Description of the Preferred Embodiments and the Drawing.

FIGS. 4a and 4b show two embodiments of an integrated structure of the apparatus of the present invention in a side view (schematic sectional diagram).

DETAILED DESCRIPTION OF THE PREFERRED EMBODIMENTS

Figure 1:
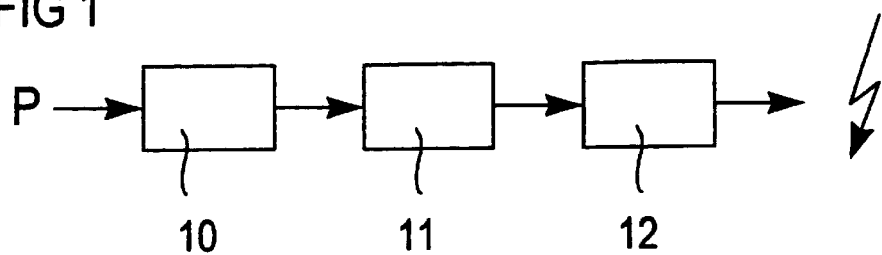
FIG. 1 shows a block diagram of the energy flow in accordance with the teachings of the present invention.

In accordance with the block diagram of FIG. 1, a converter 10 is provided which converts the respectively available process energy into electrical energy. Examples of such a converter 10 are a piezoelectric element for converting pressure/deformation energy, a pyroelectric body, a thermoelement pair, an element having the Seebeck/Peltier effect or the like for the transformation of thermal energy with a temperature gradient. An electrodynamic or piezoelectric system for converting oscillation/acceleration change energy into electrical energy is defined as low-frequency (for all these examples here). Solar cells are also suitable. It is further possible to use a friction element as the converter 10, in the case of which the friction between two differently charging materials generates an electrostatic voltage as low-frequency energy.

The magnitude of the required voltage depends on the nonlinear element and extends from a few hundred to a few thousand volts for a spark gap through ten to twenty volts for semiconductor components down to a few volts, as are sufficient for relays.

11 designates a nonlinear element. It serves to transform this so-called low-frequency energy into high-frequency energy with the inclusion of an inner switching operation for triggering a transition—taking place at time intervals—of stored low-frequency energy into energy which then assumes, or has assumed, high-frequency properties. Examples of such a nonlinear element are, in particular, a spark gap or a gas discharge tube. Also suitable is a diode with a varactor or avalanche effect, for example, or a thyristor or similarly acting semiconductor component. Also suitable in principle are switches or relays which are suitable for switching, in some instances, small currents of the low-frequency electrical energy and exhibit a corresponding nonlinear behavior. Silicon microrelays and relays with a piezoelectric reed may be mentioned here by way of example.

A multiplicity of arrangements are appropriate as the coding device 12 with, if appropriate, an additional filter property. Arrangements which operate with surface waves (SW/SAW), shear waves or bulk waves near the surface are particularly suitable for this. These may be resonator arrangements or, if appropriate, dispersive or tapped delay lines. Electroacoustic transducers are also generally suitable, as are dielectric filters, mechanical filters, coaxial ceramic filters, bulk oscillators, (e.g., quartz oscillators) or LC resonant circuit filters or the like. Particularly suitable piezoelectric materials for such electroacoustic transducers are lithium niobate, lithium tantalate, quartz, $Li_2B_4O_7$ or langasit (lanthanum-gallium-silicon oxide).

Electroacoustic transducers with pulse compression (spread spectrum communication or broadband coding methods) also can be used as the coding device. These allow the coded HF signal to be transmitted in a manner which is particularly immune to interference and is thus protected against natural (RF) interference or against intentional unauthorized influencing of the coded signal. These are, e.g. the dispersive or tapped delay lines.

The high-frequency signal may lie in any desired frequency range which is known or suitable for radio transmission and can be generated using the filters or coding devices; e.g., from a few kilohertz up to several gigahertz.

Figure 2:
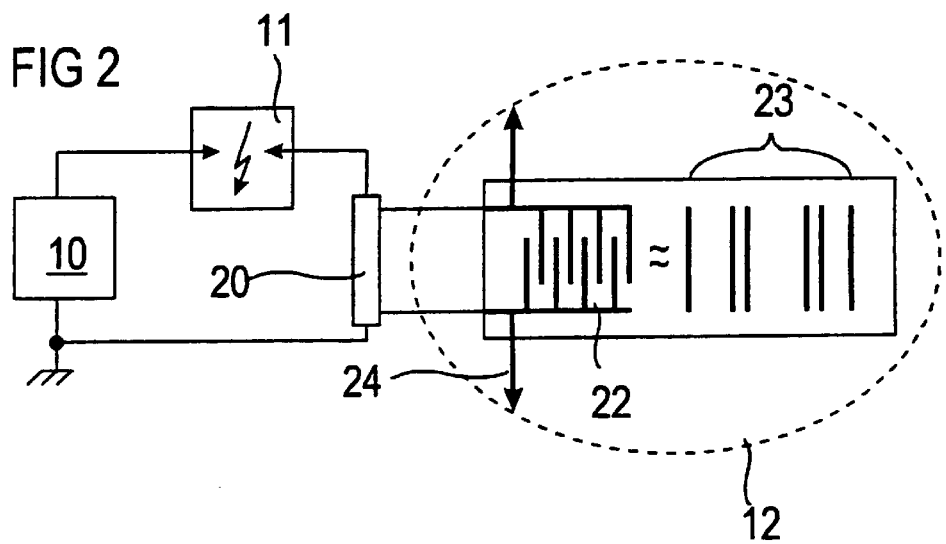
FIG. 2 shows the principle of a structure of the present invention.

Specific, practically applicable embodiments with respect to the present invention are described below. A first embodiment in accordance with FIG. 2 can be used, e.g., as a switch for switching on a device. A very interesting application, for example, is the light switch in a room, with which the lighting is switched on and off manually. This switch needs no supply line at all and can be fitted to the wall or the like without any electrical cable installation work. When the switch is pressed, a high-frequency signal is emitted with the aid of the invention; to be precise, without electric current being fed to this switch externally. A receiver fitted somewhere in the room, typically in the vicinity of the lamp, responds to the high-frequency signal and switches this lighting on and off in a wirefree, remote-controlled manner. FIG. 2 schematically shows the structure of that part of a wirefree switch with radio signals which encompasses the essential concepts of the present invention, the switch using process energy in accordance with the present invention.

Finger pressure P is applied to the converter 10 (like a conventional pressure switch) and this pressure P generates a piezoelectric voltage in the piezoelectric element of the converter 10. Suitable piezoelectric materials for such converters are, in addition to those mentioned for the electroacoustic transducers, in also PVDF (polyvinylidenedifluoride) and ferroelectric liquid-crystalline elastomers (FLCE). Such a switch also can be designed as an actuator by means of which an HF signal is generated and released, on which an information item concerning an ambient parameter can be impressed by means of the coding. What is particularly suitable for generating a high piezoelectric voltage is a mechanical actuating apparatus with a beyond dead center spring which, when loaded beyond dead center, acts abruptly with the set (mechanical) prestressed on the converter.

The converter 10 integrally or supplementarily includes an electrical charging capacitance 10' which stores the generated or separated charges until triggering of the non-linear element. The internal capacitance of piezoelectric or pyroelectric converters may be sufficient for this purpose.

In the circuit illustrated, a spark gap, for example, is provided as the nonlinear element 11. A sparkover takes place in this spark gap at the instant at which the piezoelectrically generated voltage has risen sufficiently high. Such a spark gap fulfills the condition of an electrical (current) breakdown occurring, e.g. in the nanoseconds range for the purpose of conversion into high-frequency energy, such condition having to be fulfilled for the functioning of the present invention. As an alternative, as already mentioned, it is also possible to use other elements having a correspondingly rapid breakdown behavior.

The current of this sparkover passes through an inductance element, a broadband filter 20, in order to close the circuit. The voltage drop occurring in this inductance element 20 feeds the interdigital structure 22 (converter electrodes) of a surface acoustic wave filter 21 in which, as is known, a mechanical/acoustic wave is generated. The coding may be effected by a specific configuration of the interdigital structure on the input and/or output side of the filter. It is also possible to provide a pattern 23 of reflector strips which is arranged in accordance with a coding, the "echos" of which reflector strips form the coding. If a cavity is formed in the filter, a resonant oscillation can form, the precise frequency of which forms the coding. The coded signal is obtained at the filter output.

In the exemplary embodiment, the interaction of the interdigital structure and the reflector strips leads, as is, known, to the above-described high-frequency radio signal (which is in this case, coded with the code of the structure 23) occurring at the dipoles of the antenna 24 represented and being emitted to the abovementioned receiver. A surface wave arrangement operating as a reflective delay line supplies a coding in the time domain and an arrangement operating as a resonator (not illustrated in the figure) supplies a coding in the frequency domain. In this case, too, the coding can be performed as a function of an ambient parameter.

FIG. 2 suffices once again for describing another embodiment of the present invention. In the case of an embodiment for using thermal process energy, the converter 10 is, for example, a pyroelectric body (pyroelement) provided with electrodes. For this embodiment, the arrow P represents the feeding of thermal energy. The use according to the present invention requires this thermal primary energy to have an temporal temperature gradient. This is the case, for example, with radiators (such as those used to heat rooms) with thermostatic regulation which effects fluctuations in the temperature of the radiator in the range of a few degrees Kelvin which are entirely sufficient (although surprisingly so) for the purposes of the present invention. In the case of this described embodiment, the converter 10 alternately undergoes heating and cooling, which leads to the formation of voltage of changing magnitude and polarity across the pyroelement. The nonlinear element, which for this case may again be a spark gap, has the effect that when a specific (positive or negative) voltage change is reached, a sparkover takes place which triggers the processes which have already been described above with regard to the piezoelectric embodiment.

An application which is of particular interest in this regard is the remote acquisition of heat consumption data of room heating systems, which is known per se and has operated with a different supply of energy heretofore. An embodiment as described in accordance with the principle of the present invention can be used for this, namely without the supply of electrical energy. Another advantage is that, in a manner which is fundamentally known per se, the surface wave element 21 also can be used for direct temperature measurement. The center frequency or propagation time of the narrowband high-frequency output signal of the surface wave converter is or can be made temperature-sensitive. If this surface wave element is thermally connected to the radiator, for example, the embodiment according to the present invention makes it possible, in one unit, both to measure the temperature and to generate, with heat fed in, the necessary electrical energy for the high-frequency transmission operation effected in accordance with the present invention. Each signal, thus, indicates a temperature change or a switching operation and simultaneously supplies the corresponding temperature acting on the converter (pyroelement). It is also possible to use the thermal energy not only for transformation into the HF pulse but also to perform the coding as a function of an arbitrary other variable parameter in the surroundings of the apparatus.

An embodiment which uses process energy from acceleration-varied mechanical movements of a seismic mass likewise can be described using FIG. 2. The converter includes such seismic mass and the arrow P symbolizes the mechanical energy supply which results in the oscillations of the seismic mass contained in the converter 10. This mechanical energy supply may be continuous alternating energy or else just one-off pulse energy in each case. By means of an eccentric, the energy of rotating objects also can be transformed into an HF signal which then can be coded once again with statements concerning any desired ambient parameters. Vibrations also can be determined and/or used for transformation, by means of seismic masses or by means of piezoelectric converters.

Applications of the present invention diversely arise, e.g., in the field of the operation of machines, vehicles of a variety of different types, e.g. of railroad carriages, road vehicles, rolling pallets and the like, for the purpose of monitoring or observing liquid, dissolved, gaseous or vaporous media of a variety of different types, or else of living entities to be monitored. Such an object or living entity, equipped with an apparatus according to the present invention, can (without an electric battery being required) emit coded high-frequency signals continuously (for as long as it moves or is moved) at time intervals. This can be used, on the basis of individually/differently coded HF signals at the respective objects or living entities, to distinguish these from one another remotely and, at the same time, to acquire their acceleration or movement data, temperature or other state. In the case of living entities, e.g. the movement activity of grazing animals, children or other persons in need of looking after or monitoring, they could be detected automatically. It is possible, for example, to set a specific limit value for the movement activity in this case as well, the coded signal being triggered or emitted when such activity is exceeded or undershot.

It is possible to use arrangements according to the present invention for the automatic detection of specific (e.g. thermal or mechanical) limit loads, wherein such arrangements generate an HF signal and forward it in a wirefree manner to a receiving station or to a monitoring device only when the limit load is reached. Simple monitoring of physical quantities which is active only as required is thus possible. The level of the limit load may be given by the response point of the nonlinear element or of the converter or be variably adjustable. A mechanical limit load also can be set by an additional prestressed spring which enables the piezoelectric converter to respond only when the prestressed force is reached. Thus, it is also possible to realize an automatic weight control which, when a specific weight is undershot or exceeded, transmits this information automatically by means of a coded signal to a receiver or monitoring device. A change in weight also can be detected in this way. The arrangement according to the present invention can be used for the purpose of monitoring against theft.

Figure 3:
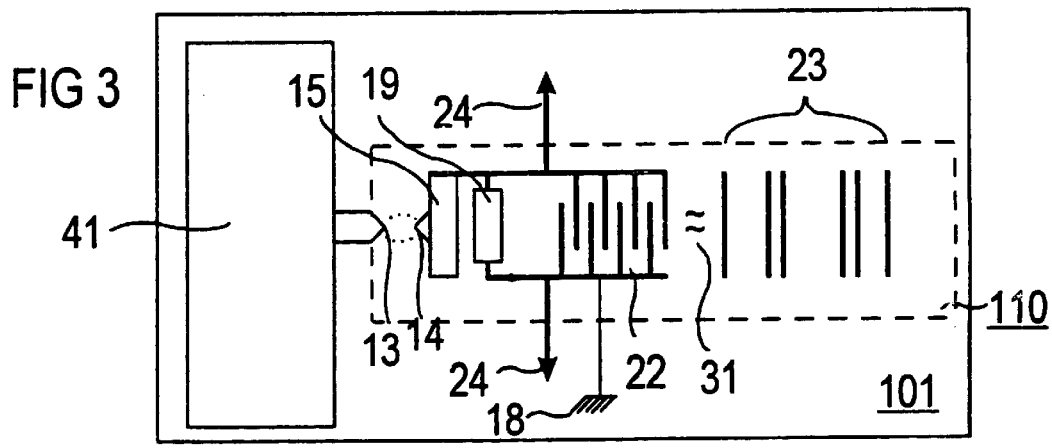
FIG. 3 shows an integrated structure of the apparatus of the present invention in a schematic plan view.

FIGS. 3 and 4 show the configuration of an arrangement according to the present invention which is of integrated construction and can be used as a calorimeter. 101 designates a laminar substrate body (e.g. 1 cm² in size) having a pyroelectric property. By way of example, this may be a ceramic made of barium titanate, lead zirconate titanate or the like or else a (mono)crystalline material made of lithium niobate, lithium tantalate or the like. Two planar electrodes 41 and 42 are provided on the two lamina surface and a pyroelectric voltage that has been generated can be picked off at such electrodes.

In the second variant according to FIG. 4b, a piezoelectric lamina 110 is arranged, e.g. bonded, on the substrate lamina 101, and is used for a surface wave arrangement (still to be described) and further functions. An optimized embodiment is the embodiment variant of FIG. 4a, in which this piezoelectric lamina 110 is an integral region of the substrate lamina 101, presupposing that the pyroelectric material of the substrate lamina 101 additionally has a piezoelectric property as well at least in this region (and is also suitable for a surface wave arrangement), as is the case with lithium niobate, lithium tantalate and similar (monocrystalline) material.

For the sake of completeness, it shall be pointed out that, for the principle of the variant according to FIG. 4b, the piezoelectric lamina 110 may, merely in an electrically connected manner, be locally positioned separately from the laminar body 101; e.g., if the lamina 110 is intended to be thermally insulated from the body 101. The present invention's principle of converting the thermal energy into a high-frequency signal is fully functional in a variant of this type as well. The advantage of thermal coupling between the pyroelectric body 101 and the piezoelectric lamina 110 of the surface wave arrangement in respect of the possibility, associated therewith, of measuring the respective temperature value will be discussed further below. With regard to that, too, the use of an integral one-piece lamina as substrate 101 and lamina 110 for the surface wave arrangement, to be precise made of monocrystalline lithium tantalate, lithium niobate and the like, is of particular interest for the present invention.

As illustrated in FIGS. 4a and 4b, the (bottom) rear side of the substrate body 101 is metallized preferably over the whole area, e.g., with aluminum (42). The opposite, top side of the substrate body 101 is preferably likewise metallized (41) over the whole area in the variant according to FIG. 4b. In the variant according to FIG. 4a, that portion of the substrate body 101 which acts/serves functionally as the piezoelectric lamina 110 is cut out in the top metallization layer, specifically in order to place the further structures that will be described below in this cut-out area. In the variant according to FIG. 4b, these structures are arranged on the separate lamina 110. Decoupling of mechanical-thermal stresses between the parts 101 and 110 is obtained if the lamina 110 is instead fastened on the body 101 by means of bonding wires that are necessary in any case.

13 and 14 respectively designate an electrode for a spark gap such electrodes, as evident from the figures, are opposite one another with tips facing one another. The spark electrode 13 is electrically connected to the metallization layer 41. The spark electrode 14, as counterelectrode, is electrically connected to a metallization layer 15, which, for its part, is connected to a ground terminal 18 via lines and an inductor coil 19 (to be described in further detail). The ground terminal 18 is, in turn, connected to the rear metallization layer 42 of the substrate 101. If a pyroelectric voltage is produced between the two electrodes 41 and 42, then it is present between the spark electrodes 13 and 14 and, on account of the nonlinear striking characteristic curve of this spark gap, the sparkover takes place only above an accumulated pyroelectric voltage value predetermined by the geometry of the spark electrodes 13 and 14. The abovementioned inductor 19 serves as DC line/low-pass filter. This inductor is preferably a meander structure or spiral structure applied as conductor strip to the surface of the lamina 110.

The temperature also can be measured simultaneously with, in particular, the illustrated and described first variant (FIG. 4a) of the embodiment of an apparatus according to the present invention. The substrate 101, and the lamina 110 functionally contained therein, proportionally is coupled thermally to the heat source on account of the pyroelectric effect. In other words, the region 110 of the surface wave structure 22/23 assumes the temperature of the radiator that is intended to be measured by means of the apparatus according to the present invention.

The SW component generates a high-frequency signal that is dependent on the temperature. In other words, the emitted coded signal contains the information of the instantaneous temperature of the lamina (and thus of the radiator). At the reception location or in a receiving and evaluation unit, it is possible in this way, from the wave emitted, for the radiator temperature to be determined from the coded signal. In order to achieve this in the second variant, the separate lamina 110 in that case is thermally coupled separately to the heat source (the radiator or the like).

By appropriately dimensioning the spark gap of the electrodes 13 and 14 and the thermal contact between the apparatus and the heat source (the radiator), that is to say by dimensioning the inflow of heat into the pyroelectric substrate 10, it is possible to choose or determine a predeterminable time sequence of successive instances of spark triggering. This affords the timing of the emission of signals from the antenna 24. Since the central receiving station has to record a multiplicity of such measurement points, that is to say incoming signals from different measurement points, it would be intrinsically necessary to temporally coordinate the signal emission of the individual measurement points. In actuality, however, the situation is such that the central station has to receive a transmission pulse lasting only microseconds from the individual measurements points; i.e., the timing ratio of transmission pulse to temporal pulse interval is extremely small. It is therefore extremely unlikely that the emission from two different measurement points of this type will coincide, and no unnecessary electrosmog is produced.

The invention provides coding in particular with the pattern of the reflector structure 23 on the SW component. As is known from such strip patterns, the variety of possible codes is extraordinarily large. The identification of an individual measurement apparatus of this type by the central station is straightforward using an apparatus accordance with the invention.

The invention apparatus can be accommodated in an integrated manner on an extremely small substrate area 101. It is thus handy and can be fitted without difficulty at very diverse, even inaccessible, locations. The integrated design means that the arrangement also can be produced cost-effectively. The example that has been explained here for a calorimeter also can be applied without difficulty to corresponding piezoelectric elements or other ceramic converters 10, or converters 10 fabricated from semiconductor, for the primary energy to be used.

A system operating with an arrangement like the arrangement according to the present invention includes the radio receiving station with signal evaluation that has already been mentioned a number of times. Within this system, there is no need for a wire connection between the arrangement and the receiving station and the apparatus itself need not be supplied with electrical energy externally, even though it does not contain an electric battery. However, a special case shall be pointed out in which an apparatus which makes use of the present invention does, in fact, contain a chargeable battery, but the latter is repeatedly charged (without electrical energy being supplied externally) during the time sequence from low-frequency electrical energy, as defined here, generated in accordance with the present invention. The arrangement thus gains autonomy which is based entirely on the use of the present invention.

Although the present invention has been described with reference to specific embodiments, those of skill in the art will recognize that changes may be made thereto without departing from the spirit and scope of the invention as set forth in the hereafter appended claims.

| List of reference symbols | |
|---|---|
| 10 | Converter |
| 11 | Transformer of low-frequency into high-frequency energy |
| 12 | Filter/coding device |
| 13/14 | Spark electrodes |
| 15 | Metallization layer |
| 19 | Inductor |
| 20 | Inductance element |
| 22 | Interdigital converter |
| 23 | Reflection strip |
| 24 | Antennas |
| 41 | Top electrode |
| 42 | Bottom electrode |
| 101 | Substrate |
| 110 | Piezoelectric lamina |

What is claimed is:

1. An apparatus for generating coded high-frequency signals, comprising:
    a converter for converting a non-electrical primary energy into low-frequency electrical energy;
    an element with a non-linear characteristic curve having a behavior that changes abruptly as a function of applied voltage starting from at least one of a specific limit value and a limit range, the element thereby generating a current pulse with a steep edge which corresponds to a high-frequency signal, the element thereby converting the low-frequency electrical energy into high-frequency electrical energy in the form of the high-frequency signal;
    a coding device for generating a coded signal from the high-frequency signal; and
    a filter for selecting a narrow signal from the high-frequency electrical energy, the filter being connected between the element and the coding device.

2. An apparatus for generating coded high-frequency signals as claimed in claim 1, wherein the coding device is sensitive with respect to at least one ambient parameter, such that an information item concerning at least one of the nature and size of the ambient parameter is impressed on the coded signal.

3. An apparatus for generating coded high-frequency signals as claimed in claim 1, wherein the converter is a radiation-sensitive component for one of IR, visible light and UV.

4. An apparatus for generating coded high-frequency signals as claimed in claim 1, wherein the coding device carries out pulse compression for the purpose of transmitting the coded signal in a manner immune to interference.

5. An apparatus for generating coded high-frequency signals as claimed in claim 1, wherein one of a dielectric filter, a mechanical filter, a ceramic filter, a coaxial ceramic filter, a bulk oscillator and an LC filter is provided as the filter.

6. An apparatus for generating coded high-frequency signals as claimed in claim 1, further comprising:
    an antenna coupled to the filter for emitting the coded signal and for driving a receiving device.

7. An apparatus for generating coded high-frequency signals as claimed in claim 1, wherein the apparatus functions as a switch for an electrical apparatus that is switchable.

8. An apparatus for generating coded high-frequency signals as claimed in claim 1, wherein the apparatus functions as a switch for an electrical apparatus that is responsive by radio.

9. An apparatus for generating coded high-frequency signals as claimed in claim 1, wherein the apparatus functions to transmit coded radio signals specific to a transmitter of a monitoring device.

10. An apparatus for generating coded high-frequency signals as claimed in claim 1, wherein the apparatus functions as an active sensor, without an additional power supply, for an ambient parameter with wire free data communication.

11. An apparatus for generating coded high-frequency signals as claimed in claim 1, wherein the converter converts a mechanical primary energy into electrical energy.

12. An apparatus for generating coded high-frequency signals as claimed in claim 11, wherein the converter is a piezoelectric element having a magnet and an electrical coil for generating electrostatic charge.

13. An apparatus for generating coded high-frequency signals as claimed in claim 1, wherein the converter converts thermal primary energy with a temporal or local gradient into electrical energy.

14. An apparatus for generating coded high-frequency signals as claimed in claim 13, wherein the converter is one of a pyroelectric element and a thermoelement.

15. An apparatus for generating coded high-frequency signals as claimed in claim 1, wherein a discharge element is provided as the element with a non-linear characteristic curve.

16. An apparatus for generating coded high-frequency signals as claimed in claim 15, wherein one of a spark gap and a gas discharge tube is provided as the discharge element.

17. An apparatus for generating coded high-frequency signals as claimed in claim 1, wherein a semiconductor component which exhibits a rapid change in resistance at a limiting voltage is provided as the element with a non-linear characteristic curve.

18. An apparatus for generating coded high-frequency signals as claimed in claim 17, wherein one of a diode operating at reverse breakdown, a varactor diode, an avalanche semiconductor element and a thyristor is provided as the element.

19. An apparatus for generating coded high-frequency signals as claimed in claim 1, wherein a relay is provided as the element with a non-linear characteristic curve.

20. An apparatus for generating coded high-frequency signals as claimed in claim 19, wherein the relay is one of a silicon microrelay and a relay with a piezoelectric reed.

21. An apparatus for generating coded high-frequency signals as claimed in claim 1, wherein an electroacoustic transducer is provided as the filter.

22. An apparatus for generating coded high-frequency signals as claimed in claim 21, wherein the electroacoustic transducer is designed as one of an SW arrangement and an arrangement operating with shear waves or with waves near the surface.

23. An apparatus for generating coded high-frequency signals as claimed in claim 22, wherein the SW arrangement is one of a resonator arrangement, a delay line, a dispersive delay line and a tapped delay line.

24. A method for generating coded high-frequency radio signals, the method comprising the steps of:

converting a non-electrical primary energy into low-frequency electrical energy;

converting the low-frequency electrical energy into high-frequency electrical energy via an element with a non-linear characteristic curve, the element having a behavior that changes abruptly as a function of applied voltage starting from at least one of a specific limit value and a limit range to thereby generate a current pulse with a steep edge which corresponds to a high-frequency signal;

filtering, if appropriate, a narrow band high-frequency signal out from a broader-band high-frequency energy; and impressing a coding on the narrow band high-frequency signal.

25. A method for generating coded high-frequency radio signals as claimed in claim 24, wherein a coding device which is sensitive to at least one ambient parameter is used for generating the coding of the narrow band high-frequency signal as a function of at least one of the nature and the size of the ambient parameter.

26. A method for generating coded high-frequency radio signals as claimed in claim 24, wherein an ambient parameter that acts on the coding device is one of a force, a pressure, a temperature, a radiation, a sudden impedance change, a nature and concentration of at least one of gases, liquids, vapors, chemical and biological substances, such that a coding of the narrow band high-frequency signal that is dependent on the ambient parameter is generated.

* * * * *